(12) United States Patent
Ko et al.

(10) Patent No.: US 6,686,266 B2
(45) Date of Patent: Feb. 3, 2004

(54) METHOD FOR FORMING A FUSE IN A SEMICONDUCTOR DEVICE

(75) Inventors: Dong-Hwan Ko, Suwon-si (KR); Seog-Hun Yoon, Suwon-si (KR); Jae-Hyun Park, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/188,990

(22) Filed: Jul. 5, 2002

(65) Prior Publication Data

US 2003/0013289 A1 Jan. 16, 2003

(30) Foreign Application Priority Data

Jul. 12, 2001 (KR) .......................................... 2001-41939

(51) Int. Cl.[7] .............................................. H01L 21/44
(52) U.S. Cl. ....................... 438/601; 438/618; 438/622; 438/629; 438/672
(58) Field of Search ................................ 438/601, 132, 438/618, 629, 622, 672

(56) References Cited

U.S. PATENT DOCUMENTS

| | | | |
|---|---|---|---|
| 6,175,145 B1 | 1/2001 | Lee et al. | |
| 6,368,951 B2 * | 4/2002 | Higashi et al. | 438/618 |
| 6,562,674 B1 * | 5/2003 | Tsuura | 438/215 |
| 2001/0038147 A1 * | 11/2001 | Higashi et al. | 257/750 |
| 2003/0146491 A1 * | 8/2003 | Tsuura | 257/530 |

* cited by examiner

Primary Examiner—Matthew Smith
Assistant Examiner—Victor V Yevsikov

(57) ABSTRACT

A method for forming a fuse pattern for repairing a bad cell includes forming a metal wiring pattern on a substrate and successively forming an insulating layer on the metal wiring pattern and the substrate. The insulating layer of a region for defining the fuse pattern is etched by using an etching gas including a fluorocarbon-type compound and a fluorosilicate-type compound, which substantially suppresses a generation of by-products. A partially exposed metal layer of the metal wiring pattern is removed to form a fuse. Accordingly, a structure such as a fence is not formed on the residue of insulating layer. Therefore, the removal process for the fence is unnecessary. As a result, the process for forming the fuse is simplified.

28 Claims, 23 Drawing Sheets

METHOD FOR FORMING A FUSE IN A SEMICONDUCTOR DEVICE

CROSS-REFERENCES TO RELATED APPLICATIONS

This application claims priority under 35 U.S.C. §119 from Korean Patent Application No. 2001-41939, filed on Jul. 12, 2001, the entirety of which is hereby incorporated by reference as if fully set forth herein.

BACKGROUND

1. Field of the Invention

The present invention relates to a method for forming a fuse, and more particularly to method for forming a fuse that is cut when a bad cell is repaired during the manufacture of a semiconductor device.

2. Description of the Related Art

Due to the widespread usage of information devices, such as computers, developments in semiconductor memory devices are rapidly progressing so as to provide a semiconductor device having a high memory storage capacity and a faster operating speed. To this end, technology in the art is focused on developing and realizing memory devices having a degree of integration, response speed, and reliability.

A semiconductor device generally may be manufactured by using a wafer composed of silicon. In general, the manufacturing technology of semiconductor devices includes a fabrication process and an assembly process. In the fabrication process, a plurality of cells having integrated circuits are manufactured by repeatedly forming predetermined patterns on a wafer. In the assembly process, the wafer having the cells thereon is cut into chip units, and then the chips are packaged. An electrical die sorting (hereinafter, referred to as "EDS") process is performed between the fabrication process and the assembly process to inspect the electrical properties of the cell formed on the wafer.

In the EDS process, each cell in a chip is inspected to determine whether the cell has good or bad electrical properties. Particularly, a cell turning out to have bad electrical properties is removed before the assembly process is carried out. By detecting the bad cell(s) prior to use and repairing the bad cell(s) effort and a cost may be reduced in the manufacturing of semiconductor devices.

The EDS process includes a pre-laser test, a repairing process and a post-laser test. In the pre-laser test, the bad cell is selected and data related to the bad cell are generated. The repairing process repairs the bad cell. That is, the repairing process uses a laser beam to cut a fuse connecting the bad cell, and the bad cell is replaced with a redundancy cell. The post-laser test re-inspects a repaired cell.

For example, a static random access memory (SRAM) device uses a gate polysilicon layer as the fuse. However, it is not easy to use the gate polysilicon layer as the fuse because an insulating interlayer has a step difference of about 20,000 Å or more when the SRAM device is comprised of a multi-layer structure. Accordingly, when the SRAM device is comprised of the multi-layer structure, the fuse is formed in a via hole, or a portion of barrier metal layer formed on a top surface of a substrate is used as the fuse.

An example of a method for forming a fuse in the via hole is disclosed in U.S. Pat. No. 6,175,145 (issued to Lee et al.).

FIGS. 1 and 2 are sectional views illustrating a conventional method for forming the fuse by using a portion of barrier metal layer.

FIG. 1 shows a fence A which is formed on a circumference of fuse 10. The fence A is formed on a region where the fuse 10 is formed because by-products generated when an insulating layer 12 is etched are adhered to an insulating layer residue. Therefore, the fence A decreases a process margin when the fuse 10 is cut due to the step difference of the fence A.

FIG. 2 shows a state that the fence is removed from the fuse 10. For that reason, the process margin is secured by means of removing the fence A.

As described above, a removing process of the fence A is performed in order to form the fuse 10. However, the removing process of the fence A lowers the process efficiency. Particularly, when the semiconductor device has a multi-layer structure, the conventional method results in a lowering of process efficiency.

SUMMARY

The present invention has been made to address the above problems of the prior art. Therefore, it is an object of the present invention to provide a simplified method for forming a fuse.

In one aspect, there is provided a method for forming a fuse. A barrier metal layer and a metal layer are sequentially formed on a substrate and the metal layer and the barrier metal layer in a first region are sequentially etched to form a metal wiring pattern and to partially expose the substrate. Then, an insulating layer is continuously formed on the metal wiring pattern and the partially exposed substrate. The insulating layer in a second region is etched by using an etching gas including a fluorocarbon-type compound and a fluorosilicate-type compound. The etching gas substantially suppresses a generation of by-products. Thus, a fuse pattern region is defined by exposing the metal wiring pattern in the second predetermined region. A residue of the insulating layer remains at a lower portion of a side wall of the metal wiring pattern. The metal layer in the metal wiring pattern of the fuse pattern is etched to form the fuse by exposing a top surface of the barrier metal layer under the metal layer.

There is also provided another method for forming a fuse, wherein a barrier metal layer and a metal layer are sequentially formed on a substrate having a lower structure formed thereon. The metal layer and the barrier metal layer in a first region are sequentially etched to form a metal wiring pattern and to partially expose the lower structure. An insulating layer is continuously formed on the metal layer and the partially exposed lower structure. The insulating layer in a second region and the lower structure under the insulating layer is sequentially etched by using an etching gas including a fluorocarbon-type compound and a fluorosilicate-type compound. The etching gas substantially suppresses a generation of by-products. Thus, a fuse pattern region is defined by exposing the metal wiring pattern in the second region. A residue of the insulating layer remains at a lower portion of a side wall of the metal wiring pattern. The metal layer in the metal wiring pattern of the fuse pattern is etched to form the fuse by exposing a top surface of the barrier metal layer under the metal layer.

There is provided still another method for forming a fuse wherein a barrier metal layer and a metal layer are sequentially formed on a substrate having a lower structure formed thereon. The metal layer and the barrier metal layer in a first region are sequentially etched to form a metal wiring pattern and to partially expose the lower structure. An insulating layer is formed continuously on the metal layer and the partially exposed lower structure. After forming a photoresist pattern on the insulating layer to expose the insulating layer in a second predetermined region of the insulating layer, the insulating layer in the second predetermined region and the lower structure under the insulating layer are sequentially etched by using an etching gas including a fluorocarbon-type compound and a fluorosilicate-type compound. The etching gas substantially suppresses a generation of by-products. Thus, a fuse pattern region is defined by exposing the metal wiring pattern in the second region. A residue of the insulating layer remains at a lower portion of a side wall of the metal wiring pattern. A portion of the metal layer of the metal wiring pattern is dry etched with a second etching gas. After completely removing the photoresist pattern, a remaining metal layer is wet etched. The wet etching has an etching selectivity of the metal layer with respect to the barrier metal layer. The fuse is formed by exposing a top surface of the barrier metal layer under the metal layer.

As disclosed herein, when the insulating layer is etched so as to form a fuse pattern, the generation of the by-products such as polymer is suppressed. Since the fence is not formed, the removing process of the fence is not necessary. Particularly, the methods disclosed herein are applicable to the manufacturing of a semiconductor device having a multi-layer structure.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION

Hereinafter, methods of forming a fuse will be described with reference to accompanying drawings.

Figure 1:
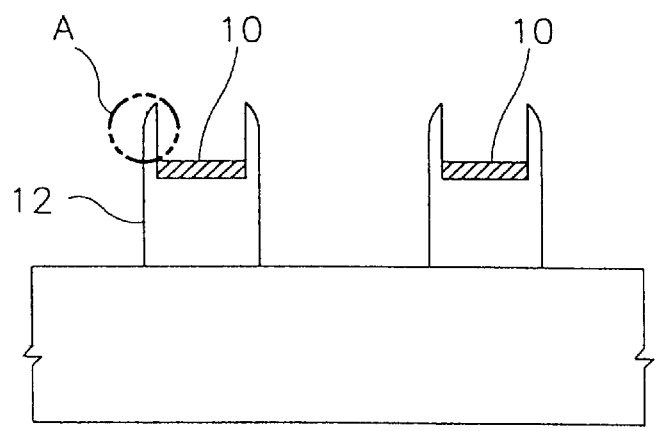
FIG. 1 and FIG. 2 are sectional views showing a conventional method for forming a fuse.
Figure 2:
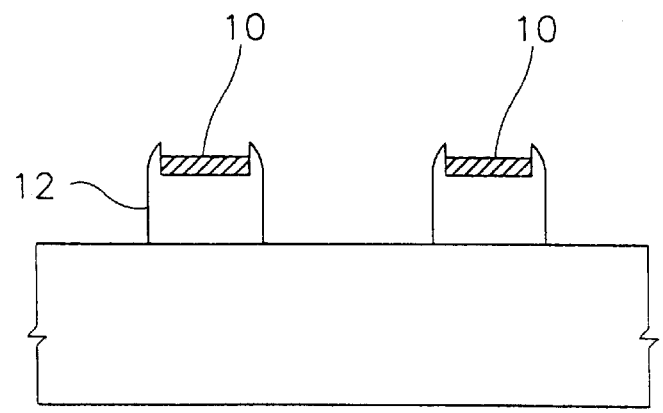
Figure 3:
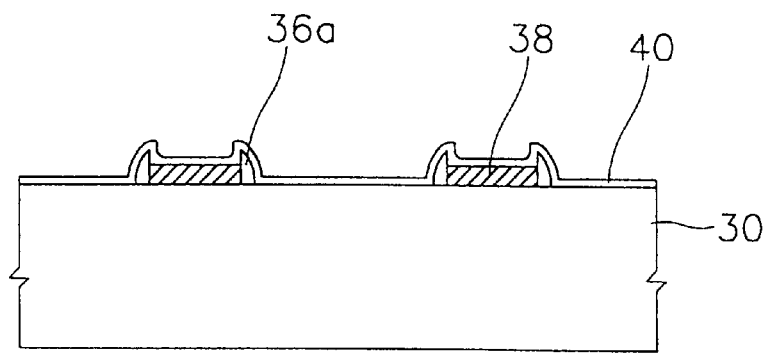
FIG. 3 is a sectional view showing a fuse according to a first embodiment.

FIG. 3 shows a fuse 38 that is formed by a method in accordance with a first embodiment. The method for forming the fuse 38 is as follows.

FIGS. 4A to 4E are sectional view showing the steps of forming a fuse according to the first embodiment of the present invention.

Figure 4A:
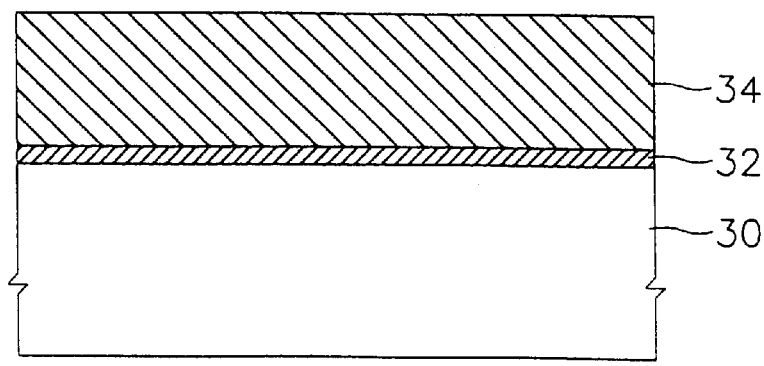
FIGS. 4A to 4E are sectional views showing a method of forming a fuse according to the first embodiment.

Referring to FIG. 4A, a barrier metal layer 32 and a metal layer 34 are sequentially formed on a substrate 30. The barrier metal layer 32 comprises a titanium layer and a titanium nitride layer formed on the titanium layer.

Figure 4B:
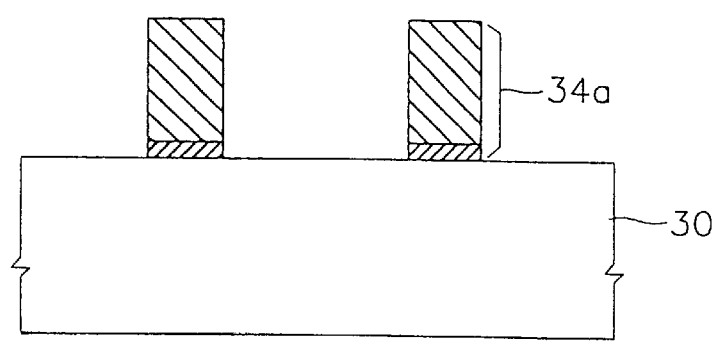

Referring to FIG. 4B, a metal wiring pattern 34a is formed by sequentially etching the metal layer 34 and the barrier metal layer 32 of a predetermined region. The metal wiring pattern 34a is a structure formed on the substrate 30 by the etching.

Figure 4C:
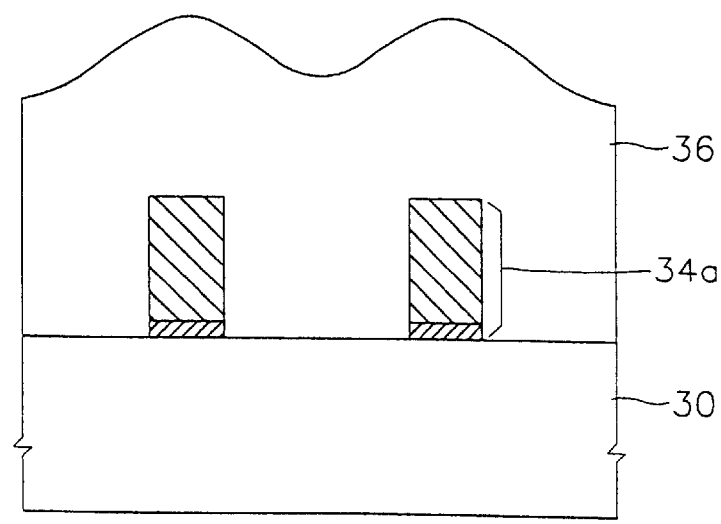

Referring to FIG. 4C, an insulating layer 36 is successively formed on the metal wiring pattern 34a and the partially exposed substrate 30. The insulating layer 36 insulates the metal wiring pattern 34a. Therefore, the insulating layer 36 comprises a layer of an oxide material, a nitride material, or a sequentially deposited layer of oxide material and nitride material.

Figure 4D:
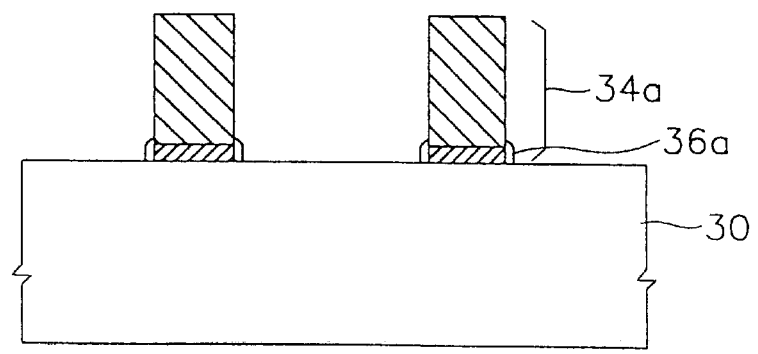

Referring to FIG. 4D, the insulating layer 36 defined by the fuse pattern region is etched to expose the metal wring pattern 34a in the fuse pattern region. The etching process is accomplished by using an etching gas including a fluorocarbon-type compound and a fluorosilicate-type compound. In the etching process, the etching gas is converted into plasma ions by applying a power of about 500 to 1,000 watts under a pressure of about 300 to 800 mTorrs so that the plasma ions may etch the insulating layer 36 in the fuse pattern region. The above range of pressure and power is most suitable to generate the plasma ions. The etching process is performed for about 150 to 300 seconds. The etching time varies in accordance with the etching amount and is based on the thickness of the insulating layer 36. In the etching, a carrier gas is used for carrying the etching gas. Therefore, the etching gas including $CF_4$ and $SF_6$ as active gases and Ar and $O_2$ as carrier gases is employed for the etching. At this time, a mixed ratio of $CF_4$, $SF_6$, Ar and $O_2$ may be about 3.5–12:0.5–2.5:25–100:1.

Particularly, an etching gas including a fluorosilicate-type compound such as $SF_6$ can suppress generation of by-products such as polymer. For that reason, though the insulating layer 36 is etched, a residue 36a of the insulating layer 36 remains on only a sidewall of the barrier metal layer 34. The residue 36a has a height so as to surround the sidewall of the barrier metal layer 34. Since the by-products are hardly generated by the etching, the residue 36a of the insulating layer 36 is not deposited on the sidewall of the metal wiring pattern 34a.

At this time, the substrate 30 under the insulating layer 36 may be etched to some degree by the etching process.

Figure 4E:
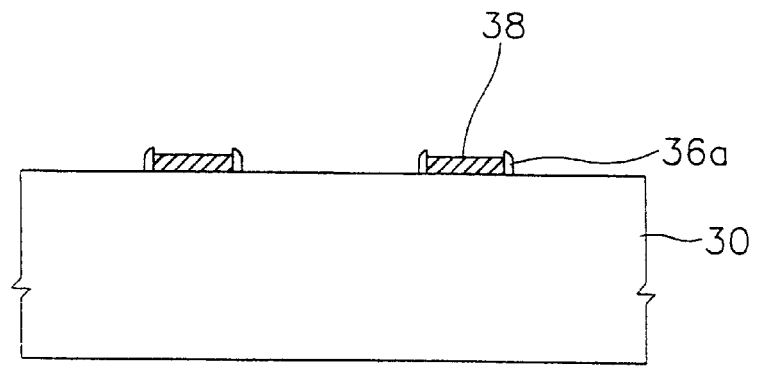

Referring to FIG. 4E, the metal layer 34 of the metal wiring pattern 34a is removed so that the barrier metal layer 32 of the metal wiring pattern 34a is exposed. Accordingly, the fuse 38 is formed. That is, the exposed barrier metal layer is used as the fuse 38.

The fuse 38 as shown FIG. 3 is completed by forming successively a passivation layer 40 on the fuse 38 and the substrate 30.

In accordance with the first method, because the etching gas comprises the fluorosilicate-type compound, the generation of the by-products can be suppressed. Accordingly, the fence is not formed on the residue of the insulating layer. Therefore, the first method does not require the process for removing the fence. As the result, the first method for forming the fuse can be simply performed.

Figure 5:
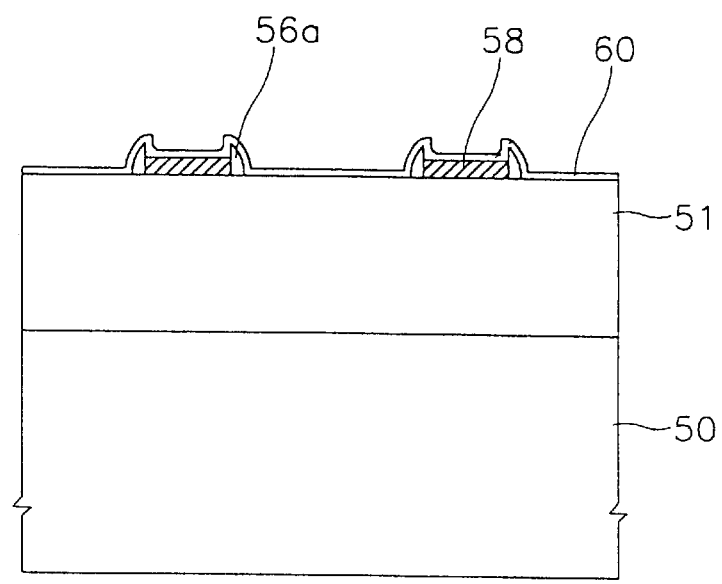
FIG. 5 is a sectional view showing a fuse according to a second embodiment.

FIG. 5 shows a fuse 58 that is formed by a method in accordance with a second embodiment. The fuse 58 in this embodiment may be formed as follows.

FIGS. 6A to 6F are sectional view for showing a method of forming a fuse according to the second embodiment of the present invention.

Figure 6A:
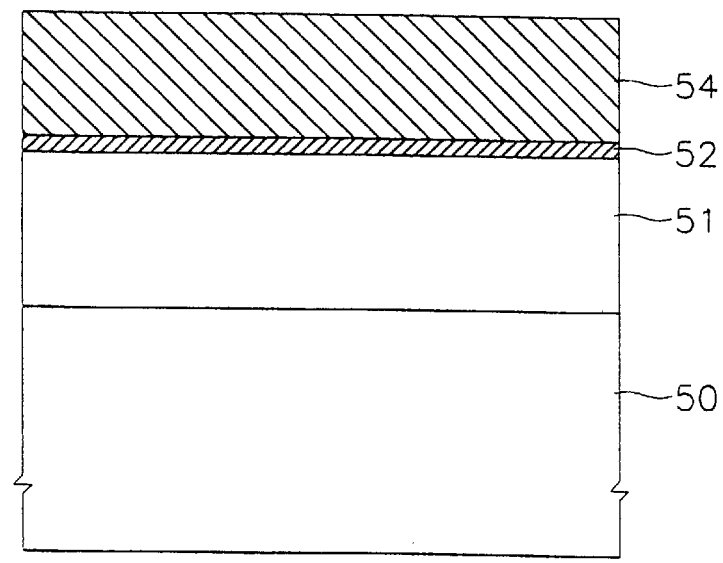
FIGS. 6A to 6F are sectional views showing a method of forming a fuse according to the second embodiment.

Referring to FIG. 6A, a barrier metal layer 52 and a metal layer 54 are sequentially formed on a lower structure 51 that is formed on a substrate 50. The barrier metal layer 52 comprises a titanium layer and a titanium nitride layer formed on the titanium layer.

Figure 6B:
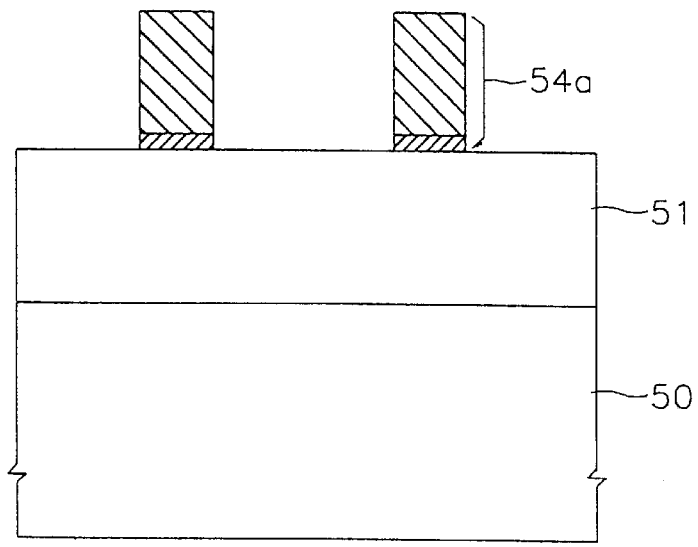

Referring to FIG. 6B, the metal layer 54 and the barrier metal layer 52 in a predetermined region are sequentially etched to form a metal wiring pattern 54a, which remains on the substrate 50 by the etching process. Accordingly, a multi-layer wiring structure is accomplished by forming the metal wiring pattern 54a on the lower structure The structure of multi-layer wiring pattern is as follows.

Figure 7:
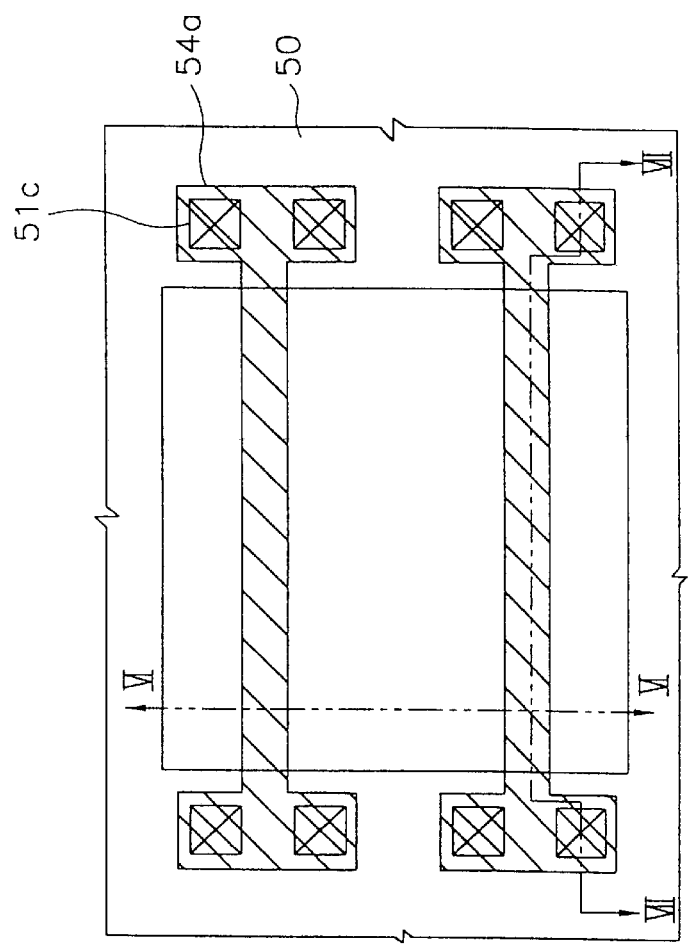
FIG. 7 is a view showing a layout including a region of fuse pattern formed according to the second embodiment.
Figure 8:
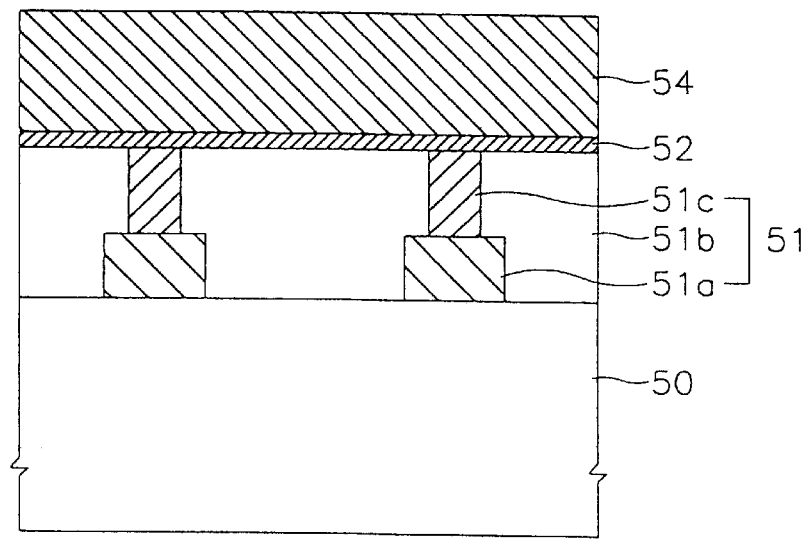
FIG. 8 is a sectional view taken along line VII—VII of FIG. 7.

FIG. 7 shows a layout of the multi-layer wiring pattern and FIG. 8 is a sectional view taken along line VII—VII of FIG. 7.

Referring to FIGS. 7 and 8, the lower structure 51 includes a lower metal wiring pattern 51a and an insulating interlayer 51b for insulating the lower metal wiring pattern 51a. In the multi-wiring pattern, the lower metal wiring pattern 51a and the insulating interlayer 51b is repeatedly deposited on the substrate 50. At this time, the lower metal wiring pattern 51a and the insulating interlayer 51b are connected by a filling material 51c which is filled in a via hole.

Figure 6C:
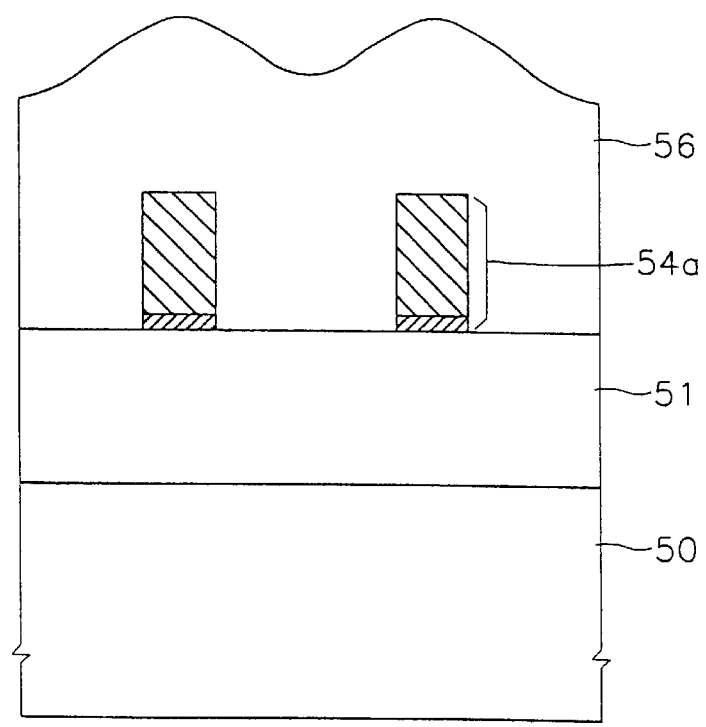

Referring to FIG. 6C, an insulating layer 56 is successively formed on the metal wiring pattern 54a and the lower structure 51. The insulating layer 56 insulates the metal wiring pattern 54a. Therefore, the insulating layer 54 comprises an oxide layer, a nitride layer, or a sequentially deposited layer of an oxide layer and a nitride layer.

Here, the fuse pattern region that is defined in the subsequent process is shown in FIG. 7. FIG. 6 corresponds to a sectional view taken along line VI—VI of FIG. 7.

Figure 6D:
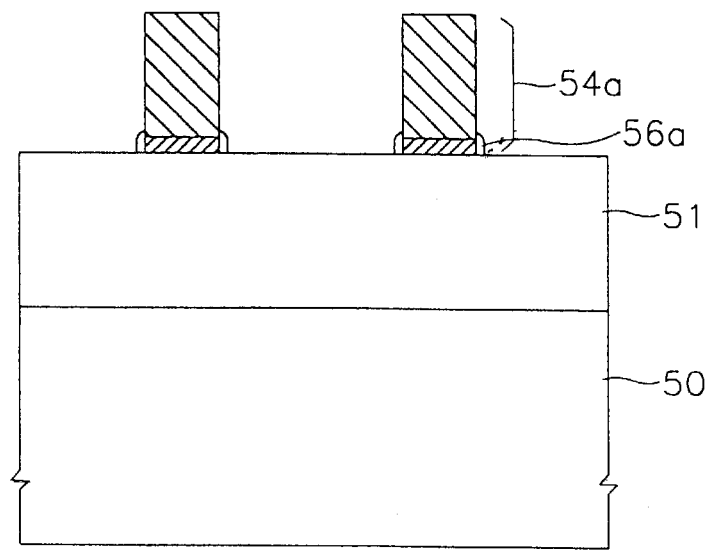

Referring to FIG. 6D, the insulating layer 56 in a region defined as the fuse pattern region is etched to expose the metal wring pattern 54a in the fuse pattern region. The etching process is accomplished by using an etching gas including a fluorocarbon-type compound and a fluorosilicate-type compound. The etching gas is converted into plasma ions by applying a power of about 500 to 1,000 watt under a pressure of about 300 to 800 mtorrs. Accordingly, the plasma ions etch the insulating layer 56 in the fuse pattern region. This range of the pressure and the power is most suitable for generating the plasma ions. The etching process is performed for about 150 to 300 seconds. The etching time is based on the thickness of the insulating layer 56. In the etching, a carrier gas is used for carrying the etching gas. Therefore, the etching gas including $CF_4$ and $SF_6$ as an active gas and Ar and $O_2$ as a carrier gas is employed for the etching. The mixed ratio of $CF_4$, $SF_6$, Ar and $O_2$ is about 3.5–12:0.5–2.5:25–100:1.

Particularly, the use of the fluorosilicate-type compound including the $SF_6$ as an etching gas can reduce a generation of by-products such as polymer. For that reason, though the insulating layer 56 is etched, a residue 56a of the insulating layer 56 remains on only a sidewall of the metal wiring pattern 54a. The residue 56a has a height so as to surround the sidewall of the barrier metal layer 52. Since the by-products are hardly generated by the etching, the residue 56a of the insulating layer 56 is not deposited on the sidewall of the metal wiring pattern 54a.

At this time, the insulating layer 56, as well as the lower structure 51 that exists under the insulating layer 56, is etched to some degree by the etching.

Figure 6E:
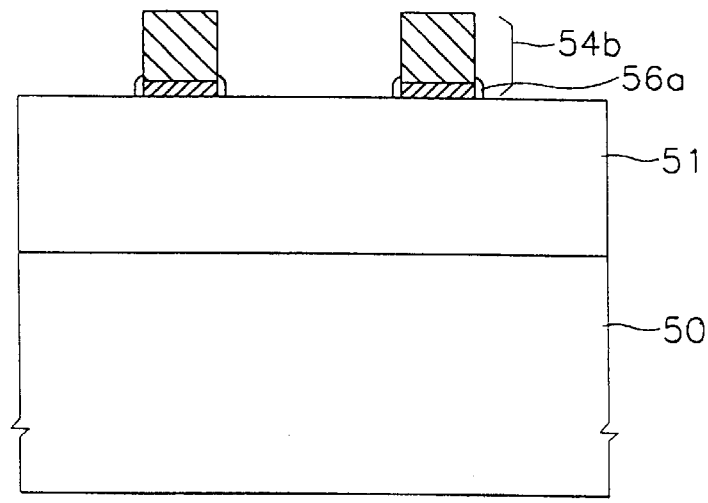

Referring to FIG. 6E, a portion of the metal layer 54 in the fuse pattern region of the metal wiring pattern 54a is etched by dry etching using a second etching gas.

Figure 6F:
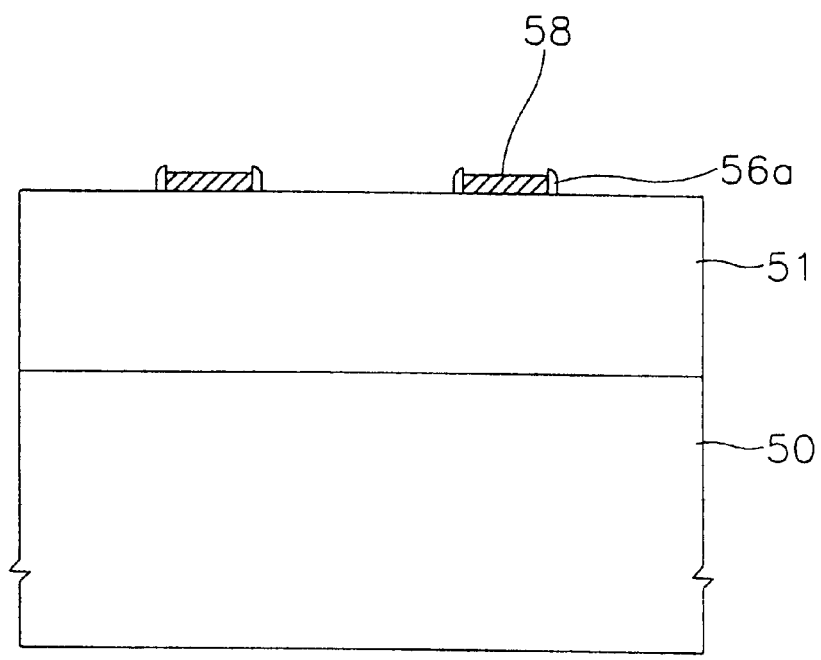

Referring to FIG. 6F, the partially etched metal layer 54b is completely etched by wet etching that has a etching selectivity of the metal layer 54 with respect to the barrier metal layer 52 to expose the barrier metal layer 52 that exists under the metal layer 54.

In this manner, the exposed barrier metal layer that exists in the fuse pattern region is used as the fuse 58.

The fuse 58 shown FIG. 5 is completed by forming successively a passivation layer 60 on the fuse 58 and the lower structure 51.

In the method of the present embodiment, because the etching gas comprises the fluorosilicate-type compound, the generation of by-products can be reduced. Accordingly, the fence is not formed on the residue of the insulating layer. Therefore, in this method, the process for removing the fence is unnecessary. As the result, the method for forming the fuse is simple.

Figure 9:
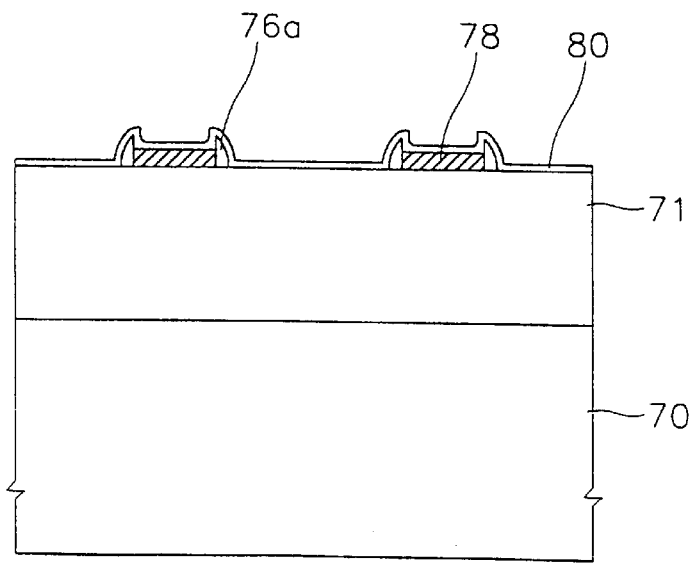
FIG. 9 is a sectional view showing a fuse according to a third embodiment.

FIG. 9 shows a fuse 78 which is formed by a method of forming a fuse in accordance with a third embodiment. This method for forming the fuse 78 is as follows.

FIGS. 10A to 10H are sectional views showing the steps of forming a fuse according to the third embodiment of the present invention.

Figure 10A:
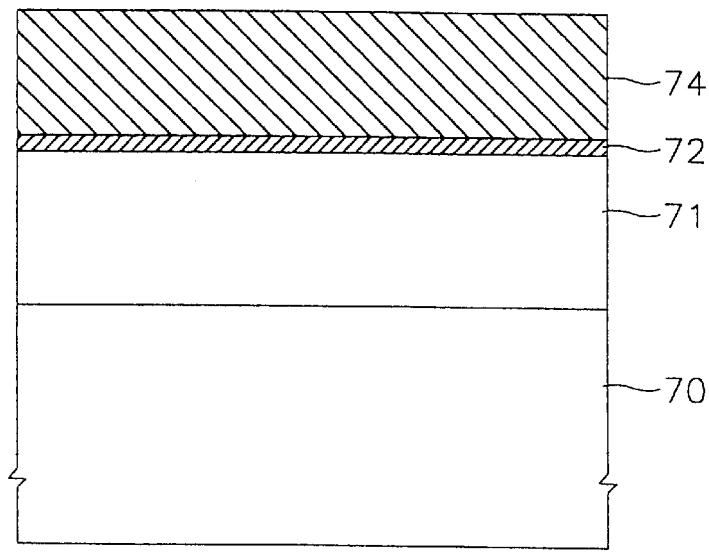
FIGS. 10A to 10H are sectional views showing a method of forming a fuse according to the third embodiment.

Referring to FIG. 10A, a barrier metal layer 72 and a metal layer 74 are sequentially formed on a lower structure 71 which is formed on a substrate 70. The barrier metal layer 72 comprises a titanium layer and a titanium nitride layer formed on the titanium layer.

Figure 10B:
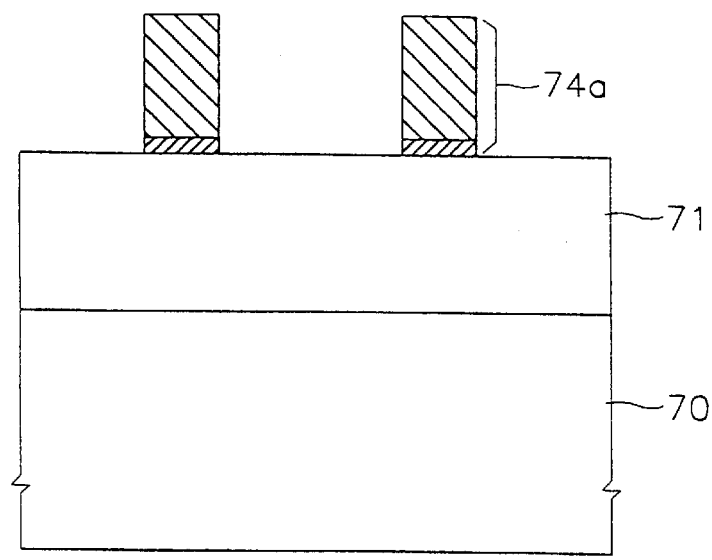

Referring to FIG. 10B, the metal layer 74 and the barrier metal layer 72 in a predetermined region is sequentially etched to form a metal wiring pattern 74a that remains on the substrate 70 after the etching process. Accordingly, a multi-layer wiring structure is accomplished by forming the metal wiring pattern 74a on the lower structure 71. The structure of a multi-layer wiring pattern is the same as shown in FIGS. 7 and 8.

Figure 10C:
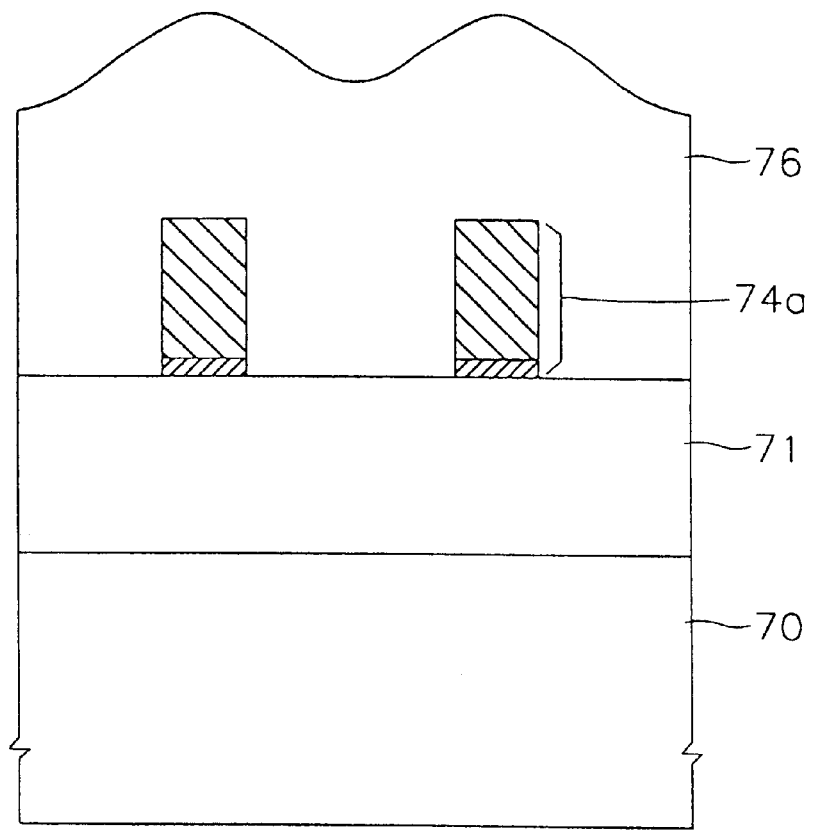

Referring to FIG. 10C, an insulating layer 76 is continuously formed on the metal wiring pattern 74a and the partially exposed lower structure 71. The insulating layer 76 insulates the metal wiring pattern 74a. The insulating layer 74 comprises an oxide layer, a nitride layer, or a sequentially deposited layer of oxide and nitride.

Figure 10D:
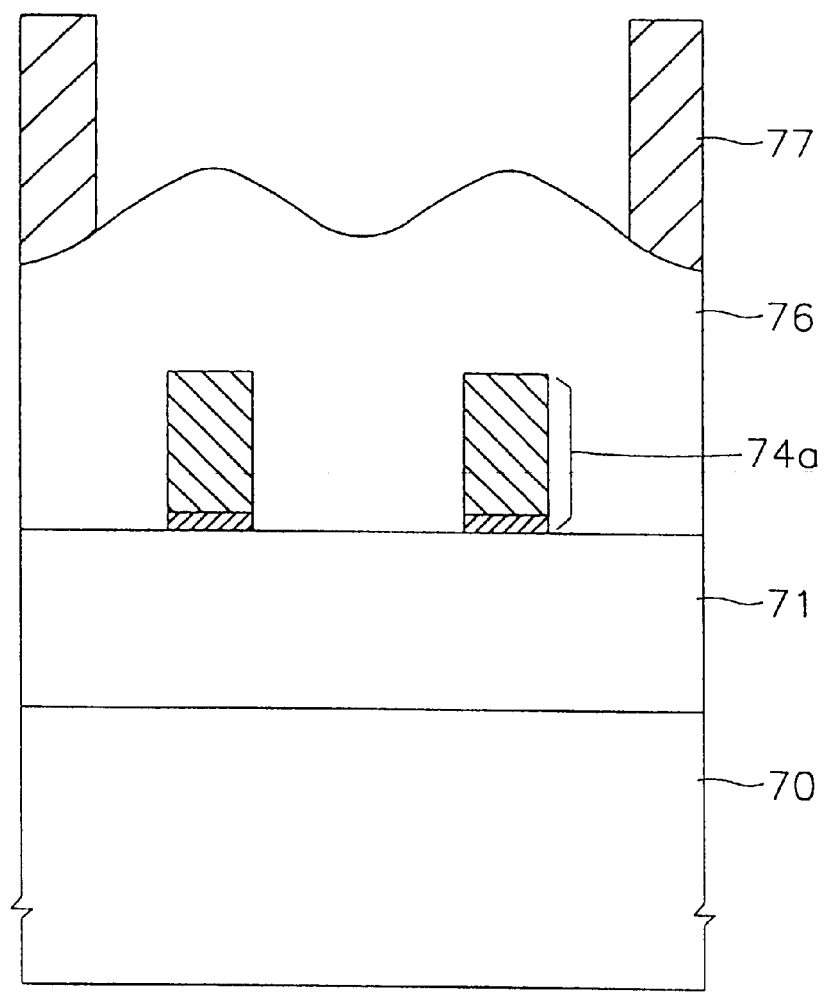

Referring to FIG. 10D, a photoresist pattern 77 for defining a fuse pattern region is formed on the insulating layer 76 by a photo process.

Figure 10E:
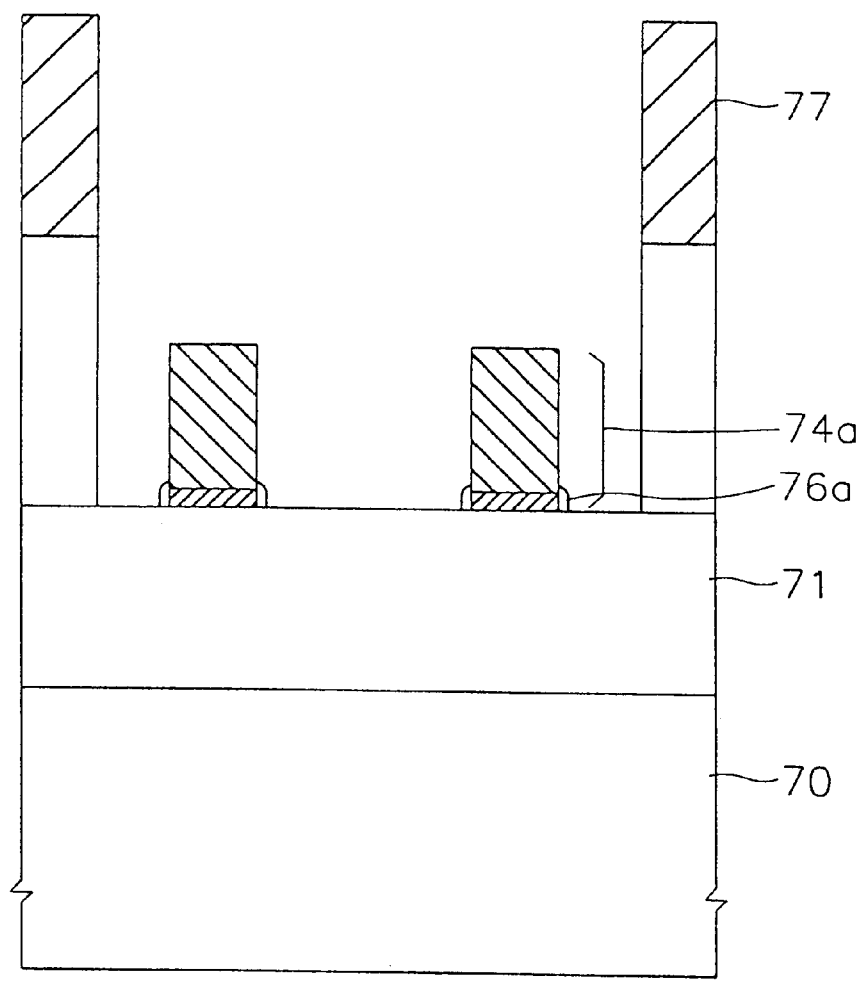

Referring to FIG. 10E, the insulating layer 76 defined in the fuse pattern region is etched to expose the metal wring pattern 74a in the fuse pattern region. The etching is accomplished by using an etching gas including a fluorocarbon-type compound and a fluorosilicate-type compound. The etching gas is converted into plasma ions by applying a power of about 500 to 1,000 watts under a pressure of about 300 to 800 mtorrs. Accordingly, the plasma ions etch the insulating layer 76. The above range of the pressure and power is most suitable to generate the plasma ions from the etching gas. The etching is performed for about 150 to 300 seconds. The etching time is based on the thickness of the insulating layer 76. In the etching, a carrier gas is used for carrying the active gases. Therefore, the etching gas includes $CF_4$ and $SF_6$ as active gases and Ar and $O_2$ as carrier gases. The mixed ratio of $CF_4$, $SF_6$, Ar and $O_2$ is about 3.5–12:0.5–2.5:25–100:1.

Particularly, the use of the fluorosilicate-type compound including the $SF_6$ can reduce a generation of by-products such as polymer. For that reason, though the insulating layer 76 is etched, a residue 76a of the insulating layer 76 remains on only a sidewall of the metal wiring pattern 74a. Since the by-products are hardly generated by the etching, the residue 76a of the insulating layer 76 is not deposited on the sidewall of the metal wiring pattern 74a. Accordingly, the residue 76a has a height so as to surround the barrier metal layer 72.

At this time, the lower structure 71 under the insulating layer 76 as well as the insulating layer 76 may be etched to some degree by the etching process.

Figure 10F:
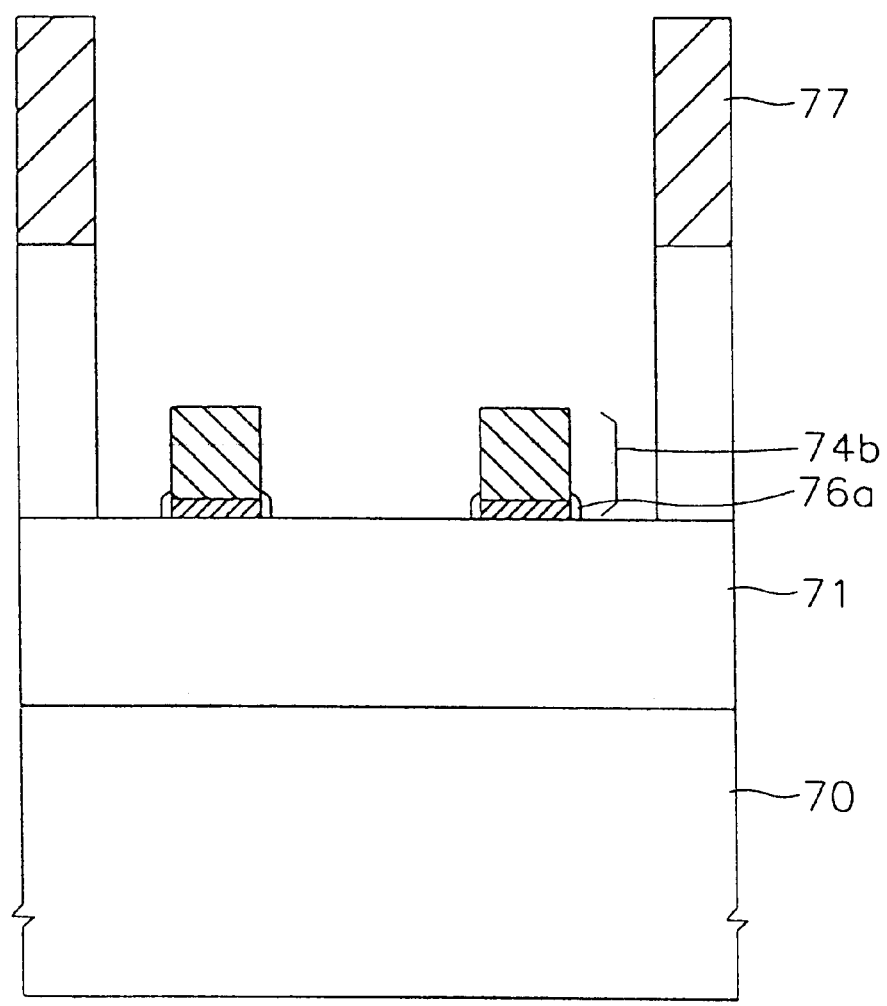

Referring to FIG. 10F, a portion of the metal layer 74 of the metal wiring pattern 74a is etched by dry etching using a second etching gas.

Figure 10G:
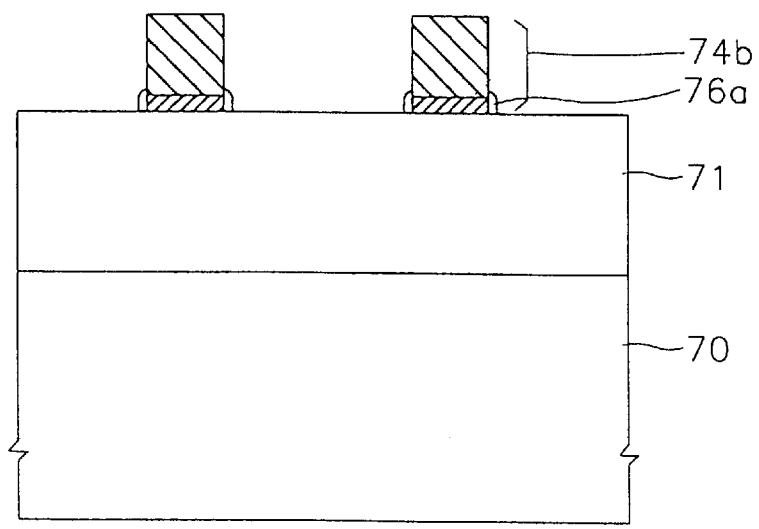

Referring to FIG. 10G, the photoresist pattern 77 that defines the fuse pattern region is completely removed.

Figure 10H:
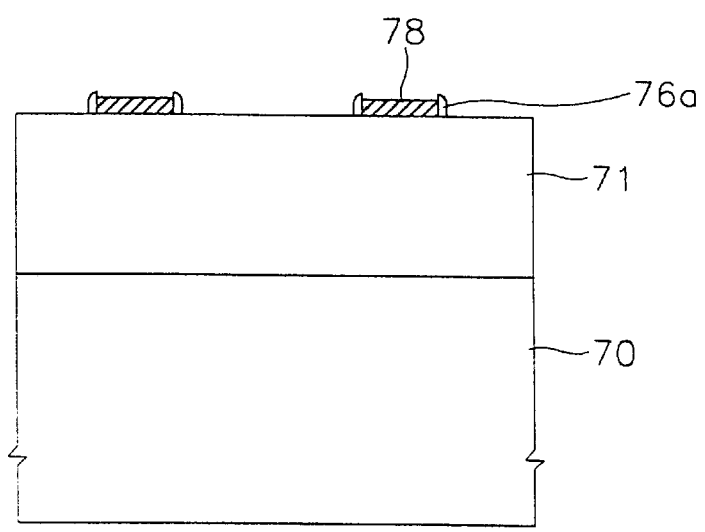

Referring to FIG. 10H, the partially etched metal layer 74b is completely etched by wet etching having an etching selectivity of the metal layer 74 with respect to the barrier metal layer 72 to expose the barrier metal layer.

In this manner, the exposed barrier metal layer that exists in the fuse pattern region is used as the fuse 78.

The fuse 78 shown FIG. 9 is completed by continuously forming a passivation layer 80 on the fuse 78 and the lower structure 71.

In the method of the present embodiment, because the etching gas comprises the fluorosilicate-type compound, the generation of by-products can be reduced. Accordingly, a structure such as the fence is not formed on the residue of the insulating layer Therefore, in this method, the process for removing the fence is not required.

As mentioned above, the methods can increase process efficiency through the simple process for forming the fuse. Particularly, when the methods are applied to a manufacturing of semiconductor device such as SRAM, the manufacturing has a high productivity.

Hereinafter, a method of manufacturing a semiconductor device wherein the method in accordance with the third embodiment will be described with reference to accompanying drawings.

FIGS. 11A to 11I are sectional views showing a method for forming a fuse in a manufacturing of semiconductor device according to one embodiment.

Figure 11A:
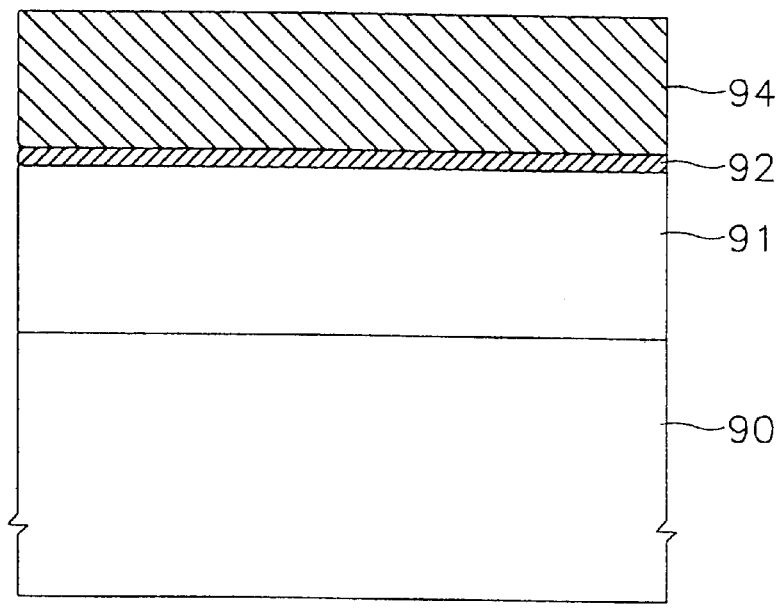
FIGS. 11A to 11I are sectional views showing a method for forming a fuse in a manufacturing of semiconductor device according to one embodiment.

Referring to FIG. 11A, a barrier metal layer 92 and a metal layer 94 are sequentially formed on a lower structure 91 which is formed on a substrate 90. The lower structure includes a lower metal wiring pattern and a first insulating interlayer.

A chemical vapor deposition method or a sputtering method is employed to form the barrier metal layer 92 including a titanium layer and a titanium nitride layer. At this time, a deposition thickness of the barrier metal layer 92 is about 900 Å. Here, the barrier metal layer 92 prevents the reaction of the lower structure 91 with the metal layer 94. A portion of the barrier metal layer 92 will be used as a fuse.

Also, a chemical vapor deposition method or a sputtering method is also employed to form the metal layer 94. At this time, a deposition thickness of the metal layer 94 is about 14,000 Å.

Figure 11B:
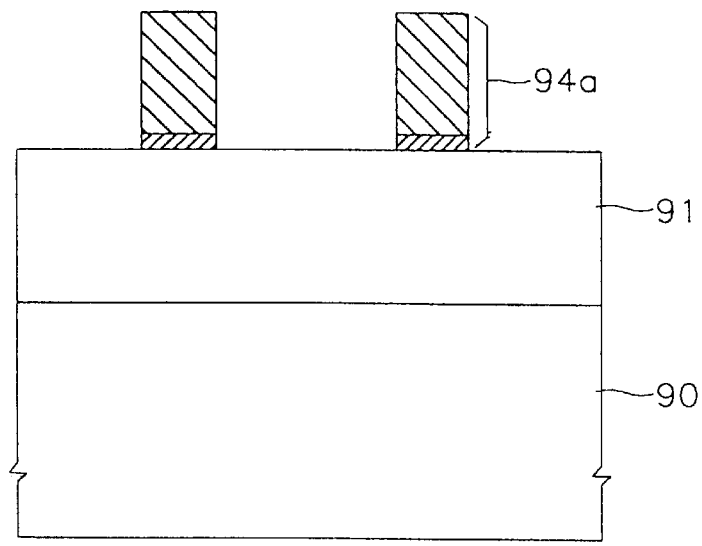

Referring to FIG. 11B, the metal layer 94 and the barrier metal layer 92 in a predetermined region are sequentially etched to form a metal wiring pattern 94a. Photolithography is employed to form the metal wiring pattern 94a.

Figure 11C:
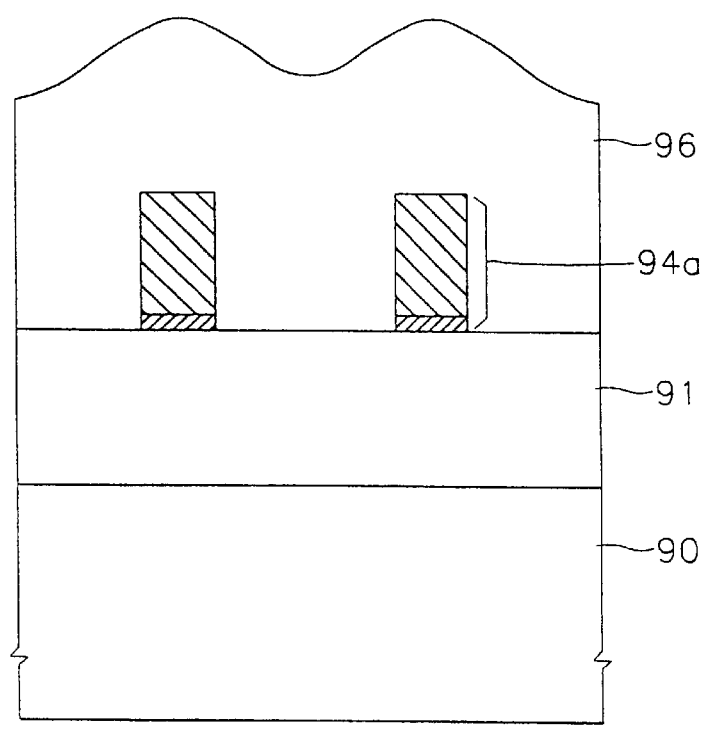

Referring to FIG. 11C, an insulating layer 96 is continuously formed on the metal wiring pattern 94a and the partially exposed lower structure 91. A plasma enhanced CVD is employed to form the insulating layer 96 including an oxide layer and a nitride layer. A deposition thickness of the insulating layer 96 is about 7,000 Å wherein a deposition thickness of the oxide layer is about 4,000 Å and a deposition thickness of the nitride layer is about 3,000 Å

Figure 11D:
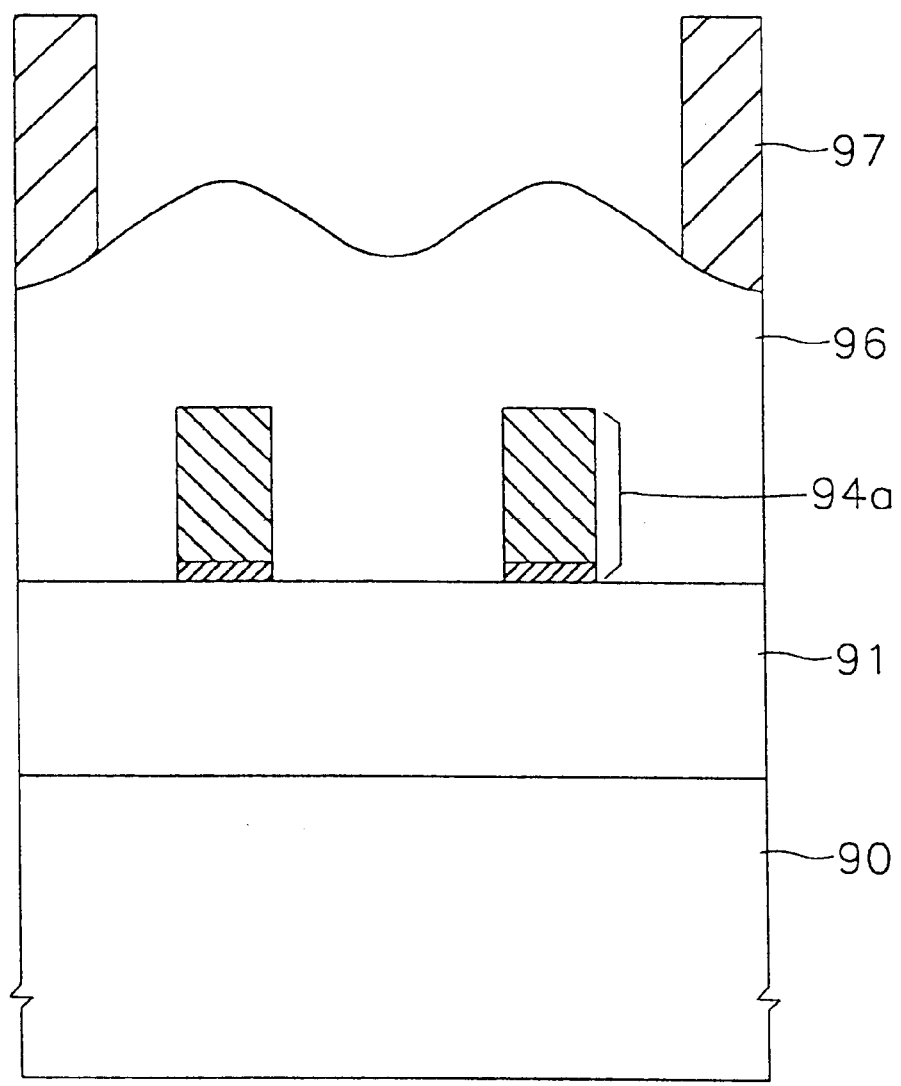

Referring to FIG. 11D, a photoresist pattern 97 for defining a fuse pattern region is formed on the insulating layer 96. The photoresist pattern 97 is accomplished by performing an exposure process and a development process after forming a photoresist layer on the insulating layer 96.

Figure 11E:
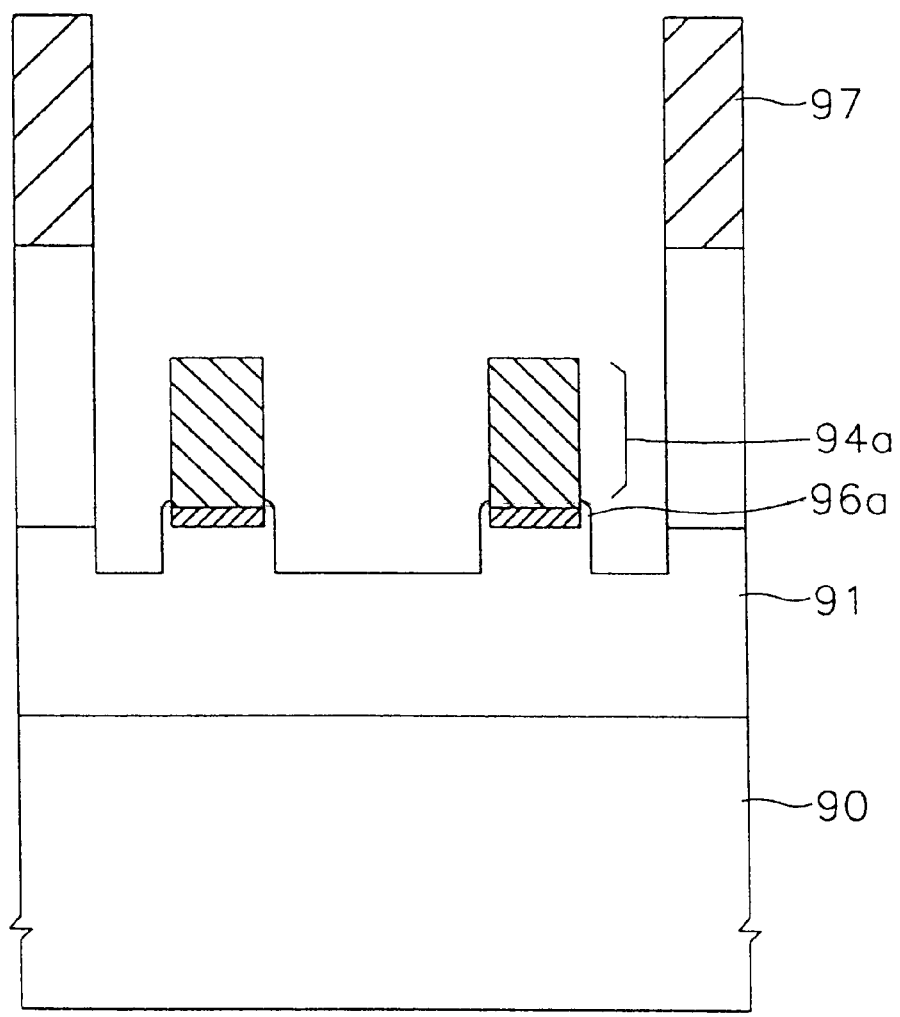

Referring to FIG. 11E, the insulating layer 96 in the fuse pattern region is etched using the photoresist pattern 97 as an etching mask. At this time, an etching depth target of the insulating layer 96 is about 14,000 Å. Accordingly, the insulating layer 96 in the fuse pattern region is completely etched and the lower structure 91 in the fuse pattern region is partially etched.

The particulars in the etching are as follow. In the etching, an etching gas comprises $CF_4$ and $SF_6$ as active gases and Ar and $O_2$ as carrier gases. At this time, a flow rate of the active gases and the carrier gases are about 100 sccm of $CF_4$, 15 sccm of $SF_6$, 800 sccm of Ar and 15 sccm of $O_2$. The etching gas is converted into plasma ions by applying a power of about 800 watts under a pressure atmosphere of 550 mTorrs. Accordingly, the plasma ions etch the insulating layer 96 and the lower structure 91. The etching process is performed for about 250 seconds. The etching may be performed in an apparatus named "TE8500S" (product name) of TEL company, or "R4528" (product name) of LRC.

While the etching is performed, by-products such as polymer are generated. However, the use of the fluorosilicate-type compound including the $SF_6$ can reduce a generation of the by-products. For that reason, the residue 96a of the insulating layer 96 is hardly deposited on the sidewall of the metal wiring pattern 94a. Thus, the insulating layer residue 96a that remains on the lower sidewall of the metal wiring pattern 94a has a thickness so as to surround the barrier metal layer 92.

Figure 11F:
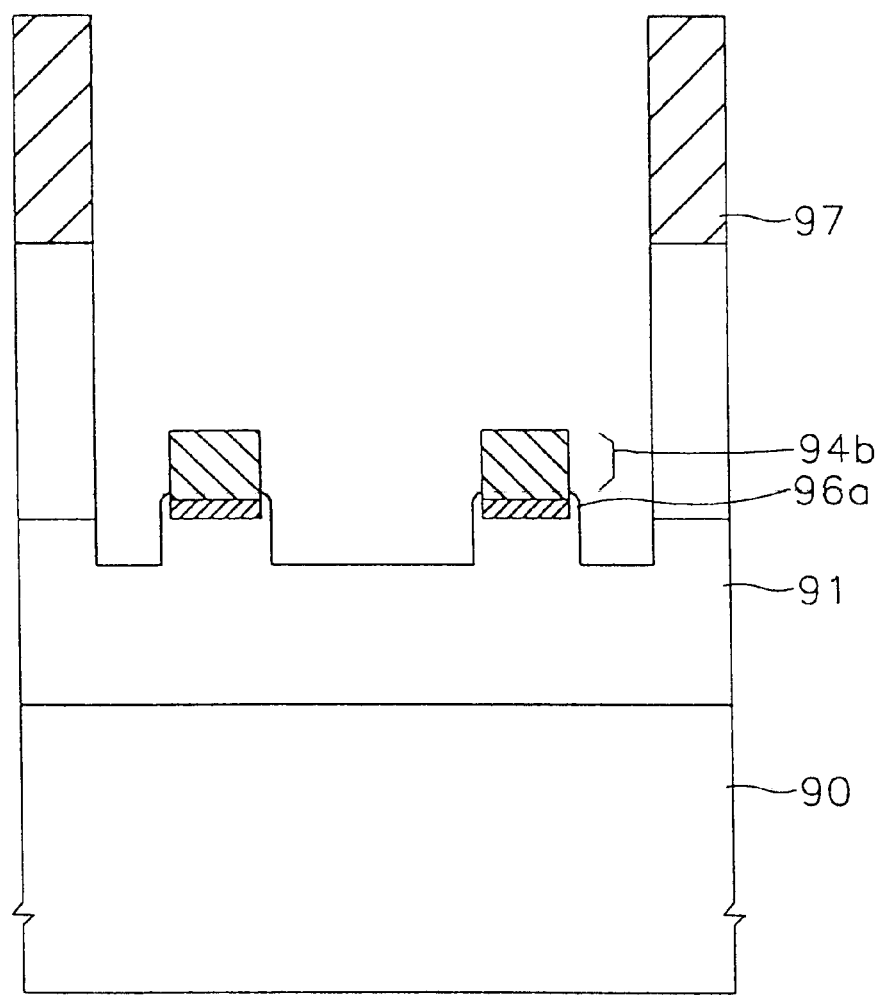

Referring to FIG. 11F, a portion of the metal layer 94 of the metal wiring pattern 94a is etched by a dry etching using a second etching gas. Here, when the metal layer 94 comprises an aluminum layer, the etching gas includes Clx. An etching depth of the metal is about 4,500 Å that equals to about 30% of the thickness of the metal layer 94.

Figure 11G:
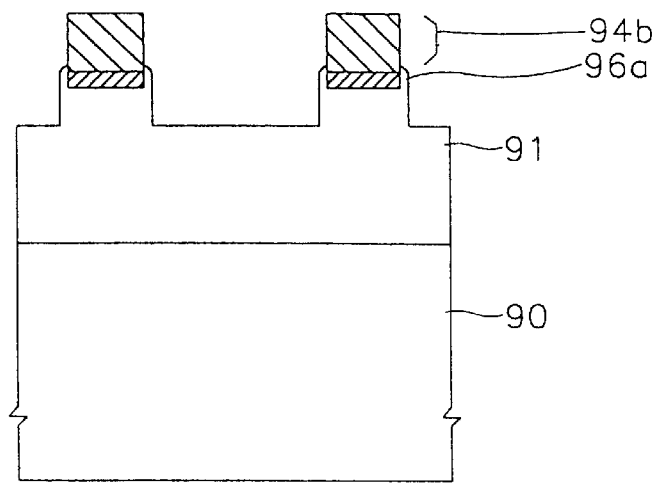

Referring to FIG. 11G, the photoresist pattern 97 is removed. An ashing process using an oxygen radical is employed to remove the photoresist pattern 97.

Figure 11H:
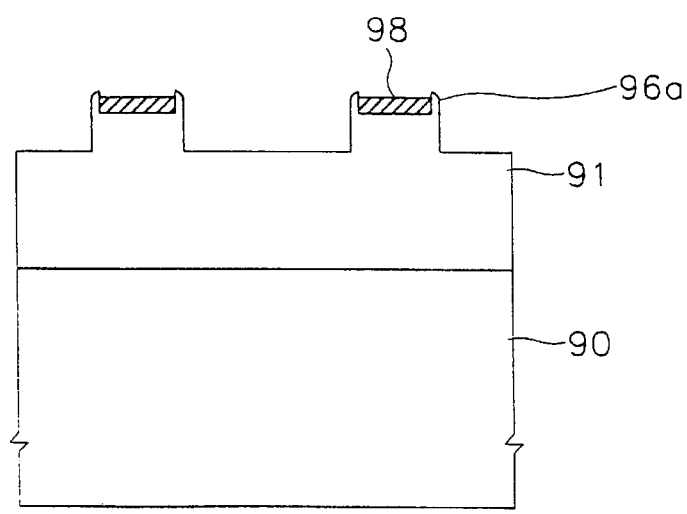

Referring to FIG. 11H, the partially etched metal layer 94b is completely removed by wet etching having an etching selectivity of the metal layer 94 with respect to the barrier metal layer 92 to expose the barrier metal layer 92. The etching selectivity of the metal layer 94 with respect to the barrier metal layer is preferably about 200:1. Accordingly, the exposed barrier metal layer 92 is used as the fuse 78.

Figure 11I:
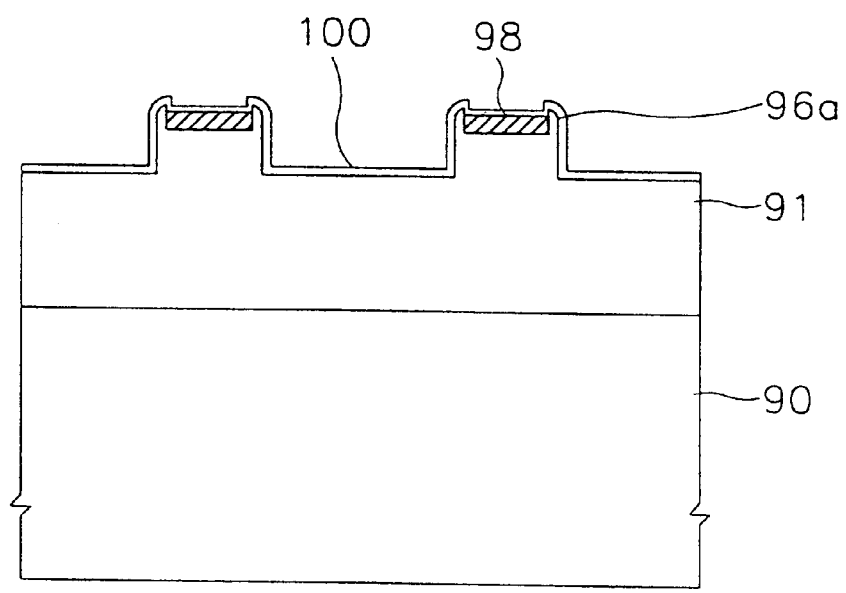

Referring to FIG. 11I, a passivation layer 100 is continuously formed on the fuse 98 and the lower structure 91. The passivation layer is formed by depositing a nitride material such as silicon nitride via a CVD method. In this manner, the fuse 78 of a semiconductor device having a multi-layer structure is formed.

In the above method, generation of by-products such as polymer is suppressed. For that reason, though the insulating layer is etched, a residue of the insulating layer remains on only a sidewall of the metal wiring pattern. Since the by-products are hardly generated by the etching, the residue of the insulating layer is not deposited on the sidewall of the metal wiring pattern. The residue has a height so as to surround the barrier metal layer. In the method of the present embodiment, the process for removing the fence is not further required. As the result, the process for forming the fuse is simple.

The process efficiency of the method for forming a fuse by using the barrier metal layer may be improved through simplicity since the process for removing the fence is unnecessary. Particularly, when the methods are applied to a manufacturing of semiconductor device wherein a portion of the barrier metal layer is used as a fuse, the manufacturing efficiency shows a high productivity. Actually, when the process as disclosed herein was applied to a manufacturing method of a semiconductor device, the productivity was increased by about 5% over the prior art.

The omission of the process for removing the fence can lower the defects in the manufacture of a semiconductor device since the defect source is eliminated. Also, because the fence is not formed, the passivation layer having a thin thickness is formed on the fuse. As a result, the fuse may be easily cut to increase the process margin.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A method of forming a fuse comprising:
   a) sequentially forming a barrier metal layer and a metal layer on a substrate;
   b) sequentially etching the metal layer and the barrier metal layer in a first region to form a metal wiring pattern;
   c) forming an insulating layer continuously on the metal wiring pattern and a surface portion of the substrate exposed by the etching step b);
   d) etching the insulating layer in a second region by using an etching gas including a fluorocarbon-type compound and a fluorosilicate-type compound, to define a fuse pattern region by exposing the metal wiring pattern in the second region, a residue of the insulating layer remaining at a lower portion of a sidewall of the metal wiring pattern; and
   e) etching the metal layer in the metal wiring pattern of the fuse pattern to form the fuse by exposing a top surface of the barrier metal layer under the metal layer.

2. The method as claimed in claim 1, further comprising the step of continuously forming a passivation layer on the fuse and on the substrate exposed by etching the insulating layer.

3. The method as claimed in claim 1, wherein the barrier metal layer comprises a titanium layer and a titanium nitride layer formed on the titanium layer.

4. The method as claimed in claim 1, wherein the insulating layer is an oxide layer, a nitride layer, or a sequentially-deposited oxide layer and nitride layer.

5. The method as claimed in claim 1, wherein the etching of the insulating layer uses an etching gas comprising $CF_4$ as the fluorocarbon-type compound and $SF_6$ as the fluorosilicate-type compound, and Ar and $O_2$ as carrier gases.

6. The method as claimed in claim 5, wherein a mixed ratio of $CF_4$, $SF_6$, Ar and $O_2$ is about 3.5–12:0.5–2.0:25–100:1.

7. The method as claimed in claim 5, wherein the etching of the insulating layer is performed for about 150 to 300 seconds, under a pressure of about 300 to 800 mTorrs, by applying a power of about 500 to 1,000 watts for generating plasma from the etching gas.

8. The method as claimed in claim 5, wherein the residue of the insulating layer remains so as to surround the barrier metal layer.

9. A method of forming a fuse pattern comprising:
   a) sequentially forming a barrier metal layer and a metal layer on a substrate having a lower structure formed thereon;
   b) sequentially etching the metal layer and the barrier metal layer in a first region to form a metal wiring pattern and to partially expose the lower structure;
   c) forming an insulating layer continuously on the metal layer and the partially exposed lower structure;
   d) sequentially etching the insulating layer in a second region and the lower structure under the insulating layer by using an etching gas including a fluorocarbon-type compound and a fluorosilicate-type compound to define a fuse pattern region by exposing the metal wiring pattern in the second region, a residue of the insulating layer remaining at a lower portion of a side wall of the metal wiring pattern; and
   e) etching the metal layer in the metal wiring pattern of the fuse pattern to form the fuse by exposing a top surface of the barrier metal layer under the metal layer.

10. The method as claimed in claim 9, further comprising the step of forming a passivation layer continuously on the fuse and on the lower structure exposed by etching the insulating layer.

11. The method as claimed in claim 9, wherein the lower structure comprises a lower metal wiring pattern and an insulating interlayer for insulating the lower metal wiring pattern.

12. The method as claimed in claim 9, wherein the barrier metal layer comprises a titanium layer and a titanium nitride layer formed on the titanium layer.

13. The method as claim in claim 9, wherein the insulating layer is an oxide layer, a nitride layer, or a sequentially-deposited oxide layer and nitride layer.

14. The method as claimed in claim 9, wherein the etching of the insulating layer uses the etching gas comprising $CF_4$ as the fluorocarbon-type compound and $SF_6$ as the fluorosilicate-type compound, and Ar and $O_2$ as carrier gases.

15. The method as claimed in claim 14, wherein a mixed ratio of $CF_4$, $SF_6$, Ar and $O_2$ is about 3.5–12:0.5–2.0:25–100:1.

16. The method as claimed in claim 14, wherein the etching of the insulating layer is performed for about 150 to 300 seconds, under a pressure of about 300 to 800 mTorrs, by applying a power of about 500 to 1,000 watts for generating plasma from the etching gas.

17. The method as claimed in claim 9, wherein the residue of the insulating layer has a thickness so as to surround at least the barrier metal layer.

18. The method as claimed in claim 9, wherein the etching of the metal layer is sequentially performed by dry etching using a second etching gas, and wet etching having an etching selectivity of the metal layer with respect to the barrier metal layer.

19. A method of forming a fuse pattern comprising:
   a) sequentially forming a barrier metal layer and a metal layer on a substrate having a lower structure formed thereon;

b) sequentially etching the metal layer and the barrier metal layer in a first region to form a metal wiring pattern and to partially expose the lower structure;

c) forming an insulating layer continuously on the metal layer and the partially exposed lower structure;

d) forming a photoresist pattern on the insulating layer to expose the insulating layer in a second region of the insulating layer;

e) sequentially etching the insulating layer in the second region and the lower structure under the insulating layer by using a first etching gas including a fluorocarbon-type compound and a fluorosilicate-type compound to define a fuse pattern region by exposing the metal wiring pattern in the second region, a residue of the insulating layer remaining at a lower portion of a side wall of the metal wiring pattern;

f) dry etching a portion of the metal layer in the metal wiring pattern with a second etching gas;

g) completely removing a photoresist pattern; and h) wet etching a remaining metal layer, the wet etching having an etching selectivity of the metal layer with respect to the barrier metal layer to form the fuse by exposing a top surface of the barrier metal layer under the metal layer.

20. The method as claimed in claim 19, further comprising the step of forming a passivation layer continuously on the fuse and on the lower structure exposed by etching the insulating layer.

21. The method as claimed in claim 19, wherein the lower structure comprises a lower metal wring pattern and an insulating interlayer for insulating the lower metal wring pattern.

22. The method as claimed in claim 19, wherein the barrier metal layer comprises a titanium layer and a titanium nitride material formed on the titanium layer, and the metal layer is an aluminum layer.

23. The method as claim in claim 19, wherein the insulating layer is an oxide layer, a nitride layer or a sequentially-deposited oxide layer and nitride layer.

24. The method as claimed in claim 19, wherein the etching of the insulating layer uses the etching gas comprising $CF_4$ as the fluorocarbon-type compound and $SF_6$ as the fluorosilicate-type compound, and Ar and $O_2$ as carrier gases.

25. The method as claimed in claim 24, wherein a mixed ratio of $CF_4$, $SF_6$, Ar and $O_2$ is about 3.5–12:0.5–2.0:25–100:1.

26. The method as claimed in claim 24, wherein the etching of the insulating layer is performed for about 150 to 300 seconds, under a pressure of about 300 to 800 mTorrs, by applying a power of about 500 to 1,000 watts for generating plasma from the etching gas.

27. The method as claimed in claim 19, wherein the residue of the insulating layer has a height so as to surround the barrier metal layer.

28. The method as claimed in claim 19, wherein the etching selectivity of the wet etching has about 190–210:1 of the metal layer with respect to the barrier metal layer barrier metal layer.

* * * * *